United States Patent [19]

Adair et al.

[11] Patent Number: 5,034,302

[45] Date of Patent: Jul. 23, 1991

[54] DEVELOPER SHEET FOR FORMING HIGH DENSITY IMAGES

[75] Inventors: Paul C. Adair, Springboro; Cheryl L. Moore, Springfield, both of Ohio

[73] Assignee: The Mead Corporation, Dayton, Ohio

[21] Appl. No.: 639,403

[22] Filed: Jan. 10, 1991

Related U.S. Application Data

[63] Continuation of Ser. No. 340,615, Apr. 19, 1989, abandoned.

[51] Int. Cl.$^5$ .............................................. G03C 1/72
[52] U.S. Cl. ................................... 430/138; 430/464; 430/466; 430/478; 430/479; 503/216; 503/225
[58] Field of Search ............... 430/138, 466, 464, 478, 430/479; 503/216, 225

[56] References Cited

U.S. PATENT DOCUMENTS

| 4,115,327 | 9/1978 | Kikuga et al. | 260/17.2 |
|---|---|---|---|
| 4,399,209 | 8/1983 | Sanders | 430/138 |
| 4,578,690 | 3/1986 | Veillette et al. | 503/212 |
| 4,775,656 | 10/1988 | Harada et al. | 430/138 |
| 4,853,364 | 8/1989 | Liang et al. | 430/138 |
| 4,877,767 | 10/1989 | Liang et al. | 430/138 |

OTHER PUBLICATIONS

Shelendich, "High-Rate Drying of Aqueous Air-Knife Coatings", TAPPI, 55, No. 3, pp. 420–423, 1972 (Abstract).

Fairchild et al., "Controlling Migration in Paper and Board Coatings", Invest. Tec. Papel 5, No. 15, pp. 53–72, 1968 (Abstract).

*Primary Examiner*—Hoa Van Le
*Attorney, Agent, or Firm*—Thompson, Hine and Flory

[57] ABSTRACT

A developer sheet useful in forming images having a high density comprising a support having front and back surfaces; and a developer layer coated from a solution on said front surface, said developer layer comprising a particulate reactive material being capable of reacting with a substantially colorless chromogenic material upon contact and generating an image, a binder material, and a viscosity increasing additive is provided. The developer sheet is particularly useful in photosensitive microencapsulated imaging systems for forming overhead transparencies.

15 Claims, No Drawings

DEVELOPER SHEET FOR FORMING HIGH DENSITY IMAGES

This is a continuation of copending application Ser. No. 340,615, filed Apr. 19, 1989 now abandoned.

BACKGROUND OF THE INVENTION

1. Field of the Invention

The present invention relates to a developer sheet for forming high density images. More particularly, the developer sheet contains a developer material coated in solution form on its upper surface which includes a particulate reactive material which is capable of reacting with a substantially colorless chromogenic material upon contact to generate an image, a binder material and a viscosity increasing additive for increasing the viscosity of the developer layer solution after coating 2. Description of the Prior Art Transfer carbonless copy systems and transfer imaging systems are well known in the art. These systems comprise two sheets which are used to form a visible image. The first sheet, the transfer or donor sheet, typically contains on one of its surfaces, a colorless color-forming agent. Often, the color-forming agent is contained in pressure rupturable microcapsules. The second sheet, the developer or receiver sheet, typically is a substrate having a layer of a developer material coated in solution form onto its front surface which can react with the colorless color-forming agent to form a visible image. In practice, to produce an image, the two sheets are aligned so that the colorless color-forming agent faces the developer material. Upon the application of pressure, the colorless color-forming agent reacts with the developer material on the developer sheet to form a visible image.

For a particular technical application, photosensitive imaging systems employing microencapsulated radiation sensitive compositions which are the subject of commonly assigned U.S. Pat. No. 4,399,209 to The Mead Corporation as well as copending U.S. patent application Ser. No. 320,643 filed Jan. 18, 1982 (corresponding to U.K. 2,113,860) have been developed. These imaging systems are characterized in that an imaging sheet including a layer of microcapsules containing a photosensitive composition in the internal phase is image-wise exposed to actinic radiation. In the most typical embodiments, the photosensitive composition is a photopolymerizable composition including a polyethylenically unsaturated compound and a photoinitiator and is encapsulated with a color former. The image-wise exposure hardens the internal phase of the exposed microcapsules. Following exposure, the imaging sheet is assembled with a developer sheet and the assembly is subjected to a uniform rupturing force by passing the sheets through the nip between a pair of pressure rollers. Upon passing through the pressure rollers, the microcapsules image-wise rupture and release their internal phase whereupon the color former migrates to the developer sheet and forms an image. The imaging system can be designed to produce monochromatic or polychromatic full color images.

Although this system has proven to be quite successful, minor drawbacks have occurred with respect to the developer sheet. More specifically, to produce the developer sheet, a developer layer, which includes a reactive developer material, typically a phenol-formaldehyde novolak resin, and a binder material is dispersed in a solvent, typically water, and the dispersion is coated onto a support. The support is thereafter heated to drive off the water, leaving a developer layer of reactive particles and binder.

When a visible image is produced by the reaction of a colorless chromogenic material with the particulate developer layer, it is important that the number and size of the pores located between the respective reactive particles of the developer layer be maintained at a maximum. According to a capillary model for oil transfer, the density of the image produced is proportional to the square root of the effective capillary radius of the developer material. Accordingly, any reduction of the number of pores and/or effective capillary radius pore size reduces the image density.

Studies have shown that during the coating and drying steps necessary to form the developer sheet, a significant problem occurs in that the binder material, which is typically a water-soluble binder such as polyvinyl alcohol, migrates to the top surface of the developer layer. As a result, the binder material can partially block the capillary pores located between the reactive particulate developer material. Thus, as the number and effective size of the capillary pore radius is reduced due to the binder migration, high density images are difficult, if not impossible to produce.

In transfer systems, two types of materials are commonly used as developer sheets. The first material is a developer coated paper and the second material is a developer coated polymeric substrate, such as polyethylene terephthalate. The end product of the latter receiver sheet is typically an overhead transparency. The above described binder migration problem is particularly pronounced in developer sheets of the second tYpe (i.e., polymeric substrates). It is hypothesized that due to the porous nature of paper, when the developer material is dried after coating onto the paper web, the water may be removed from either the top or bottom surface of the paper substrate. Accordingly, for the water removed from the bottom of the substrate, binder migration does not pose a particularly serious problem, as the bottom surface of the substrate does not contact the chromogenic material. By comparison, in the case of a polymeric substrate, evaporation of the water upon drying can only occur from the top surface of the substrate. Accordingly, any binder migration which occurs upon drying is directed towards the top of the substrate, thereby reducing the effective capillary pore size between developer particles. Thus, when desiring to produce high density images on polymeric substrates, solutions to the problem of binder migration are of particular importance.

Attempts have been made in the art to improve image density utilizing transfer systems. For example, in a nonphotosensitive imaging system, U.S. Pat. No. 4,578,690 assigned to Nashua Corporation discloses that a superior image is produced where a developer material is utilized which includes a phenol-formaldehyde condensate oligomer mixture, an aromatic carboxylic acid and an inorganic magnesium compound, in addition to conventionally used constituents such as binders, whitening agents and fillers. The reference further discloses that the viscosity of the composition can be reduced by the addition of phosphate materials, such as hexametaphosphate.

U.S. Pat. No. 4,115,327 assigned to Sumitomo Durez discloses improved aqueous color developing compositions for copying papers. The developing compositions are produced by condensing a reaction mixture including an aldehyde and a phenol to produce a novolak precondensate, emulsifying the resin condensate by agitation in the presence of an emulsifier, and treating the emulsion with wet pulverizing means. The reference further discloses that the resin may include starches, surface active agents, and protective colloid substances including, for example, polyvinyl alcohols, polyacrylamides, hydroxyethyl cellulose, methylcellulose, carboxymethyl cellulose, gum arabic, gelatin, sodium alginate, casein, polyvinyl pyrrolidone, styrene-maleic anhydride copolymers and polyacrylic acid. The reference does not consider the problem of binder migration as a result of coating the developer emulsion onto a substrate.

One solution proposed in the art to reduce the effect of binder migration on a coated paper is to simultaneously apply a vacuum to the opposite side of the coated web during the drying step. See, for example, Shelendich, J., "High-rate Drying of Aqueous Air-knife Coatings", *Tappi*, 55, No. 3, pp. 420-3 (1972). This solution is unavailable when utilizing polymeric substrates.

In a non-carbonless and a non-photosensitive imaging system technical application, it has been suggested to add a viscosity enhancing modifier to the aqueous phase of a paper coating. For example, Fairchild et al., in their article "Controlling Migration in Paper and Board Coatings", *Invest. Tec. Paper* 5, No. 15, pp. 53-72 (1968), suggest the addition of sodium alginate to aqueous starch containing coatings which are used to coat paper and board materials.

Thus, there exists a need in the art for developer sheets which are capable of producing high density images, and particularly for developer sheets which are used in photographic imaging systems.

DEFINITION

In accordance with this invention, the term "viscosity increasing additive" is used to define a material which causes the viscosity of the developer layer coating solution to sharply increase once the coating solution has been coated onto a substrate. The beneficial effect of the viscosity increasing additive is seen primarily during the coating and drying of the developer solution on the substrate, as this is when the problem of binder migration typically sets in.

SUMMARY OF THE INVENTION

In accordance with the present invention, developer sheets having a layer of developer material coated from solution and imaging systems useful for forming high density images are provided. It is particularly envisioned that the developer sheets have a substrate which comprises a transparent polymeric material. However, the use of other substrates, such as paper, may also be practiced in accordance with the present invention. The sheets and systems are particularly characterized by maintaining reactive coated developer layers which include a small amount of a viscosity increasing additive initially present in the coating solution to prevent binder migration from occurring during the coating and drying of the developer material solution.

In accordance with one embodiment of the present invention, a developer sheet is provided. The developer sheet comprises a support having front and back surfaces; and a developer layer coated on the front surface, the developer layer comprising a particulate reactive material being capable of reacting with a substantially colorless chromogenic material upon contact and generating an image, a binder material, and a viscosity increasing additive.

It is hypothesized that the presence of the viscosity increasing additive functions to significantly retard binder migration from occurring when the developer layer coating solution is coated onto the developer substrate, typically polyethylene terephthalate, and particularly when the coated substrate is dried to remove the residual coating solvent, typically water, from the coated emulsion. While not wishing to be bound by any particular theory, the inventors hypothesize that the presence of the viscosity increasing additive makes it more difficult for the constituents of the coating material, and particularly the binder, from migrating during the coating and drying operations. Prior to coating the solution including the developer material onto a substrate, the concentration of the viscosity increasing additive is relatively low to enable a uniform, fluid coating bead to be applied onto the substrate. Once the coating solvent begins to evaporate from the substrate, the concentration of the viscosity increasing additive in the coating layer increases, causing an increase in the viscosity of the coating layer. Because of the increase in concentration of the viscosity increasing additive, and hence the viscosity of the coating layer, migration of the binder material towards the top surface of the coating layer is significantly retarded. As a result, the upper surface of the developer layer primarily consists of the reactive developer particles, which have a relatively high capillary pore size between respective particles.

A further consideration is that the viscosity additive be added in a minimal amount to maximize the amount of reactive developer particles maintained throughout the developer layer and hence, maximize image density. Preferred materials for use are polysaccharides. In particular, sodium alginate is capable of significantly increasing the viscosity of the coating liquid when present in minute amounts during solvent removal.

Another embodiment of the present invention relates to a microencapsulated imaging system. The system comprises an imaging sheet comprising a support having a layer of photosensitive microcapsules on the surface thereof, said microcapsules containing a photohardenable or photosoftenable composition as the internal phase and having a chromogenic material associated therewith; and the developer sheet as defined above. The imaging system may be utilized to produce monochromatic or full color images.

Accordingly, it is an object of the present invention to provide a developer sheet capable of producing high density images as a result of the presence of a viscosity increasing additive.

A further object of the present invention is to provide a photosensitive imaging system wherein the system is capable of producing high density images as a result of the developer layer located on the developer sheet having a viscosity increasing additive.

A further object of the present invention is to provide an overhead transparency capable of producing a high density image.

These, and other objects will be readily apparent as reference is made to the detailed description of the preferred embodiment.

DETAILED DESCRIPTION OF THE PREFERRED EMBODIMENT

In describing the preferred embodiment, certain terminology will be utilized for the sake of clarity. It is intended that such terminology include not only the recited embodiments but all technically equivalents which operate in a similar manner, for a similar purpose, to achieve a similar result.

The present invention may be used for any transfer system containing a donor or imaging sheet and a developer sheet wherein the donor or imaging sheet contains an image-forming agent capable of reacting with a developer material to form an image, the developer sheet contains a developer material capable of reacting with the image-forming agent, and wherein, to produce a visible image, the donor or imaging sheet is aligned with the developer sheet and pressure is applied to the sheets to cause transfer of the image-forming agent to the developer sheet. It is particularly envisioned that the inventive developer sheet be used in association with imaging sheets containing photosensitive microcapsules containing an image-forming agent, and that the developer sheet be a transparent polymeric material. However, it is envisioned that the inventive developer sheet may be used in association with any transfer image-forming system such as carbonless transfer systems.

In accordance with a preferred embodiment, the imaging system of the present invention includes an imaging sheet having a layer of photosensitive microcapsules and a developer sheet. The imaging sheet, as well as the photosensitive compositions, photoinitiators, color formers, wall formers, encapsulation techniques and developer materials described in U.S. Pat. Nos. 4,399,209; 4,772,530; and 4,772,541 to The Mead Corporation are useful herein. These patents are incorporated herein by reference.

The developer sheet includes a substrate having a front surface and a back surface. The substrate may be made of transparent polymeric materials such as polyethylene terephthalate, translucent substrates, opaque polymeric substrates such as Melinex 329 and Melinex 470 sold by ICI Americas, polymer coated paper materials such as commercially available photographic papers and plain paper. Polymeric substrates used for overhead transparencies, such as polyethylene terephthalate, are particularly preferred substrates.

Coated onto the front surface of the developer sheet in solution form is a layer of a developer material. The developer layer solution includes a particulate reactive material, a binder for adhering the particulate reactive material to the substrate, a viscosity increasing additive, and a coating solvent.

The particulate reactive material in the developer layer is selected such that it reacts with the chromogenic material associated with the microcapsules of the imaging sheet to produce a high density image. In the most typical embodiments, the chromogenic material is a substantially colorless electron donating compound of the type conventionally used in the pressure-sensitive recording art and the developer material is an electron accepting compound.

The reactive developer can be selected from among the developers conventionally used in carbonless paper including acid clay, active clay, attapulgite, etc.; organic acids such as tannic acid, gallic acid, propylgallate; aromatic carboxylic acids such as benzoic acid, p-tert-butyl-benzoic acid, 4-methyl-3nitrobenzoic acid, salicylic acid, 3-phenyl salicylic acid, 3-cyclohexyl salicylic acid, 3-tert-butyl-5-methyl salicylic acid, 3,5-di-tert-butyl salicylic acid, 3-methyl-5-benzyl salicylic acid, 3-phenyl5-($\alpha,\alpha$-dimethylbenzyl)salicylic acid, 3-cyclohexyl-5-$\alpha$, $\alpha$-dimethylbenzyl)salicylic acid, 3-($\alpha,\alpha$-dimethylbenzyl)-5-methyl salicylic acid, 3,5-dicyclohexyl salicylic acid, 3,5-di-($\alpha$-methylbenzyl)salicylic acid, 3,5-di-($\alpha,\alpha$-dimethylbenzyl)salicylic acid, 3-($\alpha$-methylbenzyl)-5-($\alpha,\alpha$-dimethylbenzyl)salicylic acid, 4-methyl-5-cyclohexyl salicylic acid, 2-hydroxy-1-benzyl3-naphthoic acid, 1-benzoyl-2-hydroxy-3-naphthoic acid, 3-hydroxy-5-cyclohexyl-2-naphthoic acid and the like, and polyvalent metallic salts thereof such as zinc salts, aluminum salts, magnesium salts, calcium salts and cobalt salts as disclosed in U.S. Pat. Nos. 3,864,146; 3,924,027 and 3,983,292; phenol compounds such as 6,6'-methylenebis(4-chloro-m-cresol) as disclosed in Japanese Patent Publications 9,309 of 1965 and 20,144 of 1967, and Japanese Laid Open Patent Publication No. 14,409 of 1973; phenol resins such as phenol-aldehyde resins e.g., p-phenyl-phenolformaldehyde resin and phenol-acetylene resins, e.g., p-tert-butyl-phenol-acetylene resin, and polyvalent metallic salts thereof such as zinc modified phenol formaldehyde resin as disclosed in U.S. Pat. No. 3,732,120; acid polymers such as maleic acid-rosin resin and copolymers of maleic anhydride with styrene, ethylene or vinylmethylether; and aromatic carboxylic acid-aldehyde polymers, aromatic carboxylic acid-acetylene polymers and their polyvalent metallic salts as disclosed in U.S. Pat. Nos. 3,767,449 and 3,772,052. Preferred developer materials are phenolic resins.

The phenolic resins may be further modified to include amounts of unsubstituted or substituted salicylic acids in a manner known in the art.

Another class of phenolic resin useful in the present invention is the product of oxidative coupling of substituted or unsubstituted phenols or bisphenols. Oxidative coupling may be catalyzed by various catalysts but a particularly desirable catalyst is the enzyme, horseradish peroxidase. Particularly desirable developers are the resins described in commonly assigned U.S. Pat. No. 4,647,952, which is incorporated herein by reference, and more particularly the product of oxidative coupling of bisphenol A.

Especially preferred particulate developer materials are phenol-formaldehyde condensation products. More particularly, alkylphenolic resins and, still more particularly, metallated products of alkylphenolic resins are preferred. The alkyl phenols are monosubstituted by an alkyl group which may contain 1 to 12 carbon atoms. Examples of alkyl phenols are ortho- or para- substituted ethylphenol, propylphenol, butylphenol, amylphenol, hexylphenol, heptylphenol, octylphenol, nonylphenol, t-butylphenol, t-octylphenol, etc.

Another class of thermoplastic particulate developer material which may be practiced within the scope of the present invention is a resin-like condensation product of a polyvalent metal salt, such as a zinc salt, and a phenol, a phenol-formaldehyde condensation product, or a phenol-salicylic acid-formaldehyde condensation product. This developer material is available from Schenectady Chemical Co. under the designation HRJ 4250 and HRJ 4542. These products are reported to be a metallated condensation product of an ortho- or para-substituted alkylphenol, a substituted salicylic acid, and formaldehyde.

The developer layer also includes a binder material of the type known in the art. Most binder materials are water-soluble. Examples of binder materials include polyvinyl alcohol, maleic anhydride styrene copolymer, starch, gum arabic, etc. The binder material is typically present in amount of about 1 part to 10 parts per 100 parts of particulate developer material.

Also included in the developer layer coating solution is a viscosity increasing additive, typically a water-soluble material which significantly increases the viscosity of the coating layer upon removal of the coating solvent. As will be discussed in greater detail later, the additive is used in an amount sufficient to decrease the degree of migration of the binder to the top of the developer layer during coating and drying of the developer layer onto the substrate. The amount will vary with the nature of the additive, the binder and the developer. The additive is generally added in relatively small amounts, ranging from about 0.01 parts to 1.0 parts of additive per 100 parts developer material, and preferably between about 0.05 parts to 1.0 parts per 100 parts developer. It is important that the amount of additive be maintained at a minimum, as the presence of excess additive can fill the capillary pores located between the particles of the reactive developer particles. This can cause the number and/or radius of the capillary pores to be reduced, thereby resulting in the formation of lower density images. Further, the amount of additive should be maintained at a minimum to enable the coating solution to be uniformly coated onto the substrate. If the additive is initially present in too high of an amount, it is difficult, if not impossible, to form a continuous initial coating bead. For example, if the additive is present in high amounts, in the areas of higher concentration, the coating may contain a large amount of surface discontinuities, such as streaks and the like.

Compounds which are able to significantly increase the viscosity of the developer layer in relatively small amounts upon the removal of coating solvent from the developer layer typically are polysaccharide materials. Examples of such materials include sodium alginate, ammonium alginate, agar, agarose, carageenan, xanthan gum, gum karaya, guar gum, methylcellulose, hydroxypropyl methylcellulose, hydroxyethyl cellulose, carboxymethyl cellulose, and hydroxybutyl methylcellulose. Alginate compounds have proven to be particularly effective additives, with sodium alginate being a particularly preferred alginate compound. For example, an increase in concentration of sodium alginate in solution due to water removal upon drying from one to two percent can increase the viscosity of the coating solution by a factor of 10, thereby retarding binder migration in the developer layer.

Optionally incorporated with the thermoplastic developer material is one or more surfactants or plasticizers. The surfactant(s) or plasticizer(s) is selected to specifically complement the developer material to aid the developer material in coalescing and, particularly in the case of transparencies, to aid in coating. The material is preferably present in an amount of about 0.05 to 5 parts per 100 parts of developer material, more preferably about 0.5 to 1.5 parts per 100 parts. Examples of such materials include terphenyls and sodium sulfosuccinic acid. Other commonly utilized additives such as antifoaming agents, whitening agents and lubricants may also be added in minor amounts.

To produce the developer sheet, the particulate reactive material is dispersed in a liquid, typically water, to form a resin dispersion, and the binder material, viscosity increasing additive and optional additives are mixed into the dispersion. In several embodiments the presence of the binder material and/or viscosity increasing additive may aid in the dispersing of the particles. For example, polyvinyl alcohol, which is a commonly employed binder, also functions as a dispersing agent.

Once the dispersion is well mixed, it is coated onto the support by coating means known in the art. For example, a Meyer bar coater may advantageously be used. In practice, the thickness of the developer layer ranges from between about 5 microns and about 15 microns. Because the viscosity increasing additive is present in small amounts, a uniform coating is obtained.

It has been discovered that the problem of binder migration towards the top of the developer layer which, as discussed above, causes a reduction of the number and/or size of the capillary pores located between the reactive particles, usually occurs during drying. The presence of the viscosity increasing additive significantly prevents migration during drying. During drying, the dispersion liquid, typically water, is removed from the substrate, thereby increasing the concentration of the viscosity increasing additive in the coating layer. The increase in additive concentration causes the overall viscosity of the developer layer to significantly increase. It is hypothesized that the increase in viscosity of the developer layer makes it more difficult for the binder to migrate to the top surface of the developer layer by providing physical resistance against movement. Further, as discussed above, the amount of viscosity modifying additive is maintained at a small enough level to not interfere with the particulate capillary network.

The effectiveness of the viscosity increasing additive is particularly pronounced when a polymeric substrate is utilized. When paper is utilized, due to its relatively high porosity, water can be removed from both the upper and lower surfaces. Removal of water from the lower surface of the paper does not pose a problem because the binder tends to travel with the water and it is only critical that the binder not interfere with the porous network at the upper surface of the developer layer, as this is the region which reacts with the chromogenic color-former. By comparison, as polymeric substrates are not porous, water removal can only occur at the top surface of the developer layer. As a result of the inability of the water to pass through the lower surface of the substrate, it is particularly important that binder migration be retarded. The viscosity increasing additive retards migration and as such, enables high density images to be produced on polymeric substrates.

When the developer sheet is a transparent material or coating layer such as polyethylene terephthalate, the developer material may be overcoated with a discontinuous pigment. As discussed in greater detail in U.S. Pat. No. 4,554,255, after developer, the receiver sheet may be heated or subjected to pressure to cause the pigment to fuse and form an essentially transparent glossy polymeric film over the developed image.

Typical examples of useful pigments are DOW XD 899301 latex, Dow 722 latex, Dow 788 latex, products of Dow Chemical Co., UCAR 4630x latex, UCAR 4510 latex, styreneacrylic latices of Union Carbide Corp., polyvinyl acetate emulsion 202A, a product of Union Oil Company of CA, polystyrene latices 5611 and 5612, products of Union Oil Co. of CA, Polysar 1183, Polysar 9010-P and Polysar 1164, polystyrene latices of Polysar Latex Co., acrylic latex 200, a product of Union Oil Co. of CA, polyvinylidene chloride lattices, 542 and MS-153, products of Union Oil Co. of CA, Casco wax, a wax emulsion from Borden Co., and Paraco, a wax emulsion from Hercules Chemical Co. Because these latices are non-film forming, a small amount of a binder is usually used with the latex to adhere it to the developer sheet. Preferably, a binder is used in an amount of about 0.5 to 10% by weight based on the coated solid mixture. Suitable binders include starch, polyvinyl alcohol, gelatin, and film forming acrylic, vinyl acrylic and polyvinylidene chloride latices. The binder must not be used in an amount which creates a barrier to permeation of the layer by the chromogenic material.

When the developer sheet of the present invention is used in a photographic imaging system, the imaging sheet typically includes a support, for example, aluminized polyethylene terephthalate having a layer of photosensitive microcapsules coated thereon. The internal phase of the microcapsules include a photohardenable or photosoftenable compound and a colorless color-forming agent.

Positive-working photosensitive compositions useful in the present invention usually include a photoinitiator in combination with a monomer, a dimer, or an oligomer which is polymerizable to a higher molecular weight compound, or a polymer which is crosslinked upon exposure. For a negative working material a compound which is depolymerizable or otherwise photolyzable upon exposure is used.

Ethylenically unsaturated organic compounds are useful photosensitive materials. These compounds contain at least one terminal ethylene group per molecule. Typically, liquid ethylenically unsaturated compounds having two or more terminal ethylene groups per molecule are preferred. Examples of this preferred subgroup are ethylenically unsaturated acid esters of polyhydric alcohols such as ethylene glycol dimethacrylate, triethylene glycol dimethacrylate, trimethylolpropane triacrylate (TMPTA) and trimethyol propane trimethacrylate. Another example of a useful radiation sensitive composition is an acrylate prepolymer derived from the partial reaction of pentaerythritol with acrylic acid, methacrylic acid, or acrylic or methacrylic acid esters. Another group of substances useful as photosensitive compositions include isocyanate modified acrylic, methacrylic and itaconic acid esters of polyhydric alcohols.

In most cases, the photosensitive composition includes a photoinitiator. It is possible to use either homolytic photoinitiators which are converted to an active species by radiation and generate a radical by abstracting a hydrogen from a hydrogen donor, or photoinitiators which complex with a sensitizer to produce a free radical generating species, or photoinitiators which otherwise generate radicals in the presence of a sensitizer. If the system relies upon ionic polymerization, the photoinitiator may be of the anion or cation generating type, depending on the nature of the polymerization.

Examples of photoinitiators useful in the present invention include diaryl ketone derivatives, and benzoin alkyl ethers. The photoinitiator is selected based on the sensitivity of the system that is desired. Where ultraviolet sensitivity is desired, suitable photoinitiators include alkoxy phenyl ketones, O-acylated oximinoketones, polycyclic quinones, benzophenones and substituted benzophenones, xanthones, thioxanthones, halogenated compounds such as chlorosulfonyl and chloromethyl polynuclear aromatic compounds, chlorosulfonyl and chloromethyl heterocyclic compounds, chlorosulfonyl and chloromethyl benzophenones and fluorenones, and haloalkanes. In many cases it is advantageous to use a combination of imaging photoinitiators.

For use as visible light photoinitiators, the reactive dye-counter ion photoinitiators disclosed in U.S. Pat. Nos. 4,772,530 and 4,772,541 are particularly preferred.

It is possible to use various compounds as the chromogenic materials in the present invention. If the chromogenic material is encapsulated with the photosensitive composition, it should not interfere with the sensitivity of the system. One example of chromogenic material useful in the invention is colorless electron donating compounds. Representative examples of such color formers include substantially colorless compounds having in their partial skeleton a lactone, a lactam, a sulfone, a spiropyran, an ester or an amido structure such as triarylmethane compounds, bisphenylmethane compounds, xanthene compounds, fluorans, thiazine compounds, spiropyran compounds and the like. Crystal Violet Lactone, Copikem X, IV and XI (products of Hilton-Davis Co.) and commercially available cyan, yellow and magenta color forming agents are often used alone or in combination as color precursors in the present invention.

The photosensitive microcapsules used in the present invention are easily formed using conventional techniques such as coacervation, liquid-liquid phase separation, interfacial polymerization and the like. Various melting, dispersing and cooling methods may also be used.

The photosensitive compositions are usually oleophilic and can be encapsulated in hydrophilic wall-forming materials such as gelatin-type materials (see U.S. Pat. Nos. 2,730,456 and 2,800,457 to Green et al.) including gum arabic, polyvinyl alcohol, carboxymethylcellulose; resorcinol-formaldehyde wall formers (see U.S. Pat. No. 3,755,190 to Hart et al.); isocyanate wall-formers (see U.S. pat. No. 3,914,511 to Vassiliades); isocyanate-polyol wall-formers (see U.S. Pat. No. 3,796,669 to Kiritani et al.); urea formaldehyde wall-formers, particularly urea-resorcinol-formaldehyde in which oleophilicity is enhanced by the addition of resorcinol (see U.S. Pat. Nos. 4,001,140; 4,087,376 and 4,089,802 to Foris et al.); and melamine-formaldehyde resin and hydroxypropyl cellulose (see commonly assigned U.S. Pat. No. 4,025,455 to Shackle).

The developer sheet of the present invention is particularly useful in full color imaging systems such as those described in U.S. Pat. Nos. 4,772,530 and 4,7872,541, which are incorporated herein by reference. The microcapsules used in full color imaging individually contain cyan, magenta and yellow color formers and photosensitive compositions having distinctly different sensitivities. A uniform mixture of the microcapsules is distributed over the surface of the imaging support. As is explained in more detail in the above-listed references, each set of microcapsules is primarily sensitive in a different wavelength band such that the microcapsules can be individually exposed with minimum cross-talk. In panchromatic systems, the cyan, magenta, and yellow forming photosensitive microcapsules are respectively sensitive to red, green and blue light.

The present invention is illustrated in more detail by the following non-limiting examples:

COMPARATIVE EXAMPLE 1

A coating formulation for use as a developer layer in an overhead transparency was produced by dispersing 55 parts of a developer particulate material, Schenectady, HR4542 developer resin, in 45 parts deionized water to form a developer emulsion. The coating formulation was coated onto a sheet of polyethylene terephthate using a slot-dye applicator, at a level of 35% solids, using a coating speed of 50 ft/min. The coating formulation was dried at 60° C. to remove the water and form a developer layer. To determine image densities, a donor sheet containing microcapsules having in their internal phases colorless cyan, magenta, yellow and black color-forming agents was aligned with the developer sheet to form an assembly, and the assembly was passed between the nip of two pressure rollers to rupture the microcapsules and enable their contents to transfer to the developer sheet. The densities of the images obtained are set forth in Table 1.

EXAMPLES 1(a)-1(c)

The experiment of Comparative Example 1 was repeated with the exception that the coating formulation included (a) 0.1 parts (w/w), (b) 0.5 parts and (c) 1.0 parts of Knox gelatin (Photo T4340). The image density data obtained by using the modified formulations are set forth in Table 1.

EXAMPLES 2(a)-2(c)

The experiment of Comparative Example 1 was repeated with the exception that the coating formulation included (a) 0.1 parts (w/w), (b) 0.5 parts and (c) 1.0 parts of Rousselot Type 1 Photographic Grade gelatin. The image density data obtained by using the modified formulations are set forth in Table 1.

EXAMPLES 3(a)-3(c)

The experiment of Comparative Example 1 was repeated with the exception that the coating formulation included (a) 0.1 parts (w/w), (b) 0.2 parts and (c) 0.5 parts of high viscosity sodium alginate (Sigma). The image density data obtained by using the modified formulations are set forth in Table 1.

EXAMPLES 4(a)-4(b)

The experiment of Comparative Example 1 was repeated with the exception that the coating formulation included (a) 0.1 parts (w/w) and (b) 0.5 parts of medium viscosity sodium alginate (Sigma). The image density data obtained by using the modified formulations are set forth in Table 1.

TABLE 1

| Sample | Transmission Density | | | |
|---|---|---|---|---|
| | Cyan | Magenta | Yellow | Black |
| Comp. Ex. 1 (control) | 0.75 | 0.39 | 0.50 | 0.76 |
| Example 1(a) | 0.65 | 0.36 | 0.48 | 0.82 |
| Example 1(b) | 0.70 | 0.37 | 0.52 | 0.81 |
| Example 1(c) | 0.82 | 0.42 | 0.54 | 0.88 |
| Example 2(a) | 0.74 | 0.39 | 0.52 | 0.82 |
| Example 2(b) | 0.58 | 0.33 | 0.45 | 0.85 |
| Example 2(c) | 0.84 | 0.43 | 0.53 | 0.86 |
| Example 3(a) | 0.74 | 0.38 | 0.50 | 0.83 |
| Example 3(b) | 0.79 | 0.41 | 0.53 | 0.82 |
| Example 3(c) | 0.84 | 0.42 | 0.55 | 1.00 |
| Example 4(a) | 0.79 | 0.41 | 0.54 | 0.83 |
| Example 4(b) | 0.86 | 0.43 | 0.57 | 0.94 |

As is demonstrated by the data, the presence of the viscosity increasing additive produces an increase in image density for each of the color-forming reactions. Particularly referring to Examples 3(a)-3(c) and Examples 4(a)-4(b), when using sodium alginate as the additive, improved results can be obtained by the addition of relatively minor amounts. This is particularly beneficial as the risk of blocking or clogging of the capillary network is maintained at a minimum. Further, when using transparent supports, the amount of background haze associated with the support is maintained at a minimum when sodium alginate is used as the additive. By comparison, when using modifiers requiring greater amounts of addition, such as gelatin additives, background haze can deter from the overall quality of the image produced, rendering it a less desirable commercial alternative.

Having described the invention in detail and by reference to preferred embodiments thereof, it will be apparent that modifications and variations are possible without departing from the scope of the appended claims.

What is claimed is:

1. A developer sheet useful in forming images having a high density comprising a support having front and back surfaces; and
   a developer layer coated from a solution on said front surface, said developer layer comprising a particulate reactive material selected from the group consisting of acid clays, aromatic carboxylic acids and polyvalent metal salts thereof, phenolic resins and polyvalent metal salts thereof, polymers of aromatic carboxylic acids with aldehydes or acetylene and polyvalent metal salts thereof, and organic acids and polyvalent metal salts thereof; a binder material selected from the group consisting of polyvinyl alcohol, maleic anhydride styrene copolymer, starch and gum arabic; and from 0.01 to 1.0 parts of sodium or ammonium alginate per 100 parts of particulate reactive materials.

2. The developer sheet according to claim 1 wherein said support is a polymeric film.

3. The developer sheet according to claim 2 wherein said support is polyethylene terephthalate.

4. The developer sheet according to claim 1 wherein said support is paper.

5. The developer sheet according to claim 1 wherein said developer is a phenolic resin or a polyvalent metal salt thereof.

6. The developer sheet of claim 1 wherein said developer is a polyvalent metal salt of a salicylic acid.

7. The developer sheet according to claim 1 wherein the amount of said alginate in said developer layer ranges from about 0.05 parts to about 1.0 parts per 100 parts of developer.

8. A microencapsulated imaging system comprising:
   an imaging sheet comprising a support having a layer of photosensitive microcapsules on the surface thereof, said microcapsules containing a photohardenable or photosoftenable composition as the internal phase and having a chromogenic material associated therewith; and
   a developer sheet comprising a support having front and back surfaces and a developer layer coated from a solution on said front surface, said developer layer comprising a particulate reactive material selected from the group consisting of acid clays, aromatic carboxylic acids and polyvalent metal salts thereof, phenolic resins and polyvalent metal salts thereof, polymers of aromatic carboxylic acids with aldehydes or acetylene and polyvalent metal salts thereof, and organic acids and polyvalent metal salts thereof; a binder material selected from the group consisting of polyvinyl alcohol, maleic anhydride styrene copolymer, starch and gum arabic; and from 0.01 to 1.0 parts of sodium or ammonium alginate per 100 parts of particulate reactive materials;

wherein said chromogenic material and said particulate reactive material are capable of reacting to form a visible image on said developer sheet.

9. The imaging system according to claim 8 wherein said photohardenable or photosoftenable composition comprises a photohardenable composition including an ethylenically unsaturated monomer and a photoinitiator.

10. The imaging system according to claim 9 wherein the support of said developer sheet is a polymeric film.

11. The imaging system according to claim 10 wherein said polymeric film is polyethylene terephthalate.

12. The imaging system according to claim 9 wherein the support is paper.

13. The imaging system according to claim 9 wherein said developer is a phenolic resin or a polyvalent metal salt thereof.

14. The imaging system according to claim 9 wherein said developer is a polyvalent metal salt of salicylic acid.

15. The imaging system according to claim 9 wherein the amount of said alginate in said developer layer ranges from about 0.05 parts to about 1.0 parts per 100 parts of developer.

* * * * *